United States Patent [19]

Klug et al.

[11] Patent Number: 5,313,156

[45] Date of Patent: May 17, 1994

[54] APPARATUS FOR AUTOMATIC HANDLING

[75] Inventors: Mark W. Klug; Thomas E. Toth; Theodore C. Guenther, all of San Diego; Martin Twite, Coronado, all of Calif.; Kazuyuki Tsurishima, Saitama, Japan; Mitsuaki Tani, Saitama, Japan; Minoru Baba, Saitama, Japan; Teruaki Sakurada, Saitama, Japan

[73] Assignee: Advantest Corporation, Tokyo, Japan

[21] Appl. No.: 803,159

[22] Filed: Dec. 4, 1991

[51] Int. Cl.$^5$ .................. G01R 31/28; B07C 5/344
[52] U.S. Cl. .................. 324/158 F; 324/158 R; 209/573; 414/416
[58] Field of Search ............ 324/158 F, 158 P, 73.1; 209/573, 571; 414/126, 225, 404; 361/380, 383, 384

[56] References Cited

U.S. PATENT DOCUMENTS

| | | | |
|---|---|---|---|
| 3,664,499 | 5/1972 | Sahakian | 209/81 |
| 4,000,798 | 1/1977 | Cedrone | 193/32 |
| 4,234,418 | 11/1980 | Boissicat | 209/542 |
| 4,370,011 | 1/1983 | Suzuki et al. | 339/74 R |
| 4,423,815 | 1/1984 | Boissicat | 209/573 |
| 4,715,501 | 12/1987 | Sato et al. | 209/573 |
| 4,760,924 | 8/1988 | Sato et al. | 324/158 F |
| 4,836,797 | 6/1989 | Riechelmann | 324/158 F |
| 4,926,118 | 5/1990 | O'Connor et al. | 324/158 F |
| 5,148,100 | 9/1992 | Sekiba | 324/158 F |
| 5,150,797 | 9/1992 | Shibata | 324/158 F |

Primary Examiner—Vinh Nguyen
Attorney, Agent, or Firm—Knobbe, Martens, Olson & Bear

[57] ABSTRACT

An integrated circuit (IC) device test handler which is adaptable to receive various customer tray configurations and automatically test the ICs within. The test handler comprises a customer tray magazine input area, a load section, a soak chamber, a test section, an unsoak chamber and an unload area. Two magazines containing customer trays with IC devices are input to the handler. An elevator mechanism raises the customer trays within one magazine at a time to a position which can be accessed by the loader of the test handler. A catcher device moves the trays to a buffer platform where the trays can be accessed by a transfer arm. The transfer arms moves the customer trays to one of two load stages. A pick and place apparatus removes the IC devices from each customer tray on the load stages and transfers them to a precisor for alignment and then to a test tray. The test trays are conveyed through a soak chamber to simulate certain environmental conditions and then through a double test head chamber where the IC devices are tested. The test trays are returned to ambient conditions through an unsoak chamber. A pair of unload pick and place apparatus move tested IC devices from the test trays to customer trays waiting on unload stages. The transfer arm moves the customer trays to various tray magazines based on the test results. Elevators under the magazines step down as each full customer tray is placed thereon.

24 Claims, 6 Drawing Sheets

APPARATUS FOR AUTOMATIC HANDLING

FIELD OF THE INVENTION

This invention relates to an apparatus and method for automatic test handling of electric devices such as integrated circuits ("ICs"), semiconductor chips and the like, and, more particularly, to a test handler having improved IC transfer, test sequence and sorting capabilities in order to provide enhanced productivity and reliability for the testing of integrated circuits.

BACKGROUND OF THE INVENTION

In the electronics industry, there is a constant demand for electronic devices, such as integrated circuits or semiconductor chips, to be produced less expensively and in smaller dimensions. One way to increase productivity of such electronic devices, and thereby reduce their unit cost, is to increase the test speed of the devices by testing a plurality of them at the same time.

It has become a test technology standard to place a number of electronic devices to be tested on a test tray and position them so as to be engaged by a test head plate having a number of corresponding test contactors. One device is placed on a seat of a carrier module, and each carrier module is provided with one or more device seats. A number of modules are then positioned by column and row on a test tray. The test tray, having a number of such carrier modules, is arranged so as to be in vertical alignment (either above or below) with a test fixture.

The test fixture includes test contactors (test pins) for contact with the pins of each device to be tested for supplying and receiving the test signals from the device. Each module is aligned with a corresponding test contactor so that when either the test tray or the test fixture are moved in a vertical direction toward the other, the contactor engages the electronic device positioned within the carrier module.

The contactor is provided with a number of test pins or leads which come into electrical communication with the leads of the electronic devices to be tested. The automatic test handler is electrically connected to a electronic device test system, for example, an IC tester which includes a test signal generator for supplying a test signal to the device, and with a signal comparator for analyzing the results of the test. Based on such results, the electronic devices are transferred to another location in the test process and sorted for proper handling.

In test handling equipment of the prior art, a number of disadvantages have become apparent. First, even with such automatic handling equipment, there is a need for extensive handling of individual ICs or chips. For example, there is a need to remove the electronic devices to be tested from a container and to place the devices in an appropriate position on the test tray prior to testing. It is also necessary, following the test, to remove the tested devices from the test tray, to sort them based on the test results, and to replace the devices into their original containers for return shipping to the customer or other appropriate destination.

Because of recent demands in the electronics industry, various new types of IC packaging have been developed. Furthermore, containers for such new IC packages have also been developed and are changing in configuration from time to time. An example of such a container is referred to as a "customer tray," wherein a number of IC devices are aligned in a horizontal plane in a manner similar to the test tray, as described above. However, customer trays have not been standardized, and the size, shape, capacity and spacing between the seats of the devices vary widely from manufacturer to manufacturer. The spacing in the customer tray may also be different from that required for the test tray. This is particularly true since the test tray requires more accuracy for securing the perfect contact between the test contactor and the IC device leads. Although the customer trays themselves have not been standardized, the industry has standardized the containers, referred to as "cassettes" or "magazines," in which the customer trays are housed for storage and shipping.

Thus, in summary, an automatic test handler is necessary which can be compatible with a wide variety of customer tray configurations and dimensions. At the same time, there is an increasing demand for greater test productivity so as to reduce the cost of IC devices. Moreover, with the decreasing IC size, weight and lead length, accurate testing becomes even a greater challenge.

Thus, there is a serious need in the integrated circuit industry for an automatic test handler which can overcome the problems and disadvantages described above.

SUMMARY OF THE INVENTION

The present invention comprises an improved automatic test handling system which is compatible with a wide variety of customer tray configurations and which therefore can be used to test substantially increased volumes of ICs during a given time. This compatibility is achieved, in part, by the use of a unique loader section on the present test handler which transfers ICs to be tested from the customer tray to a test tray having extremely accurate dimensions. The accuracy of the test tray utilized in the present handler ensures precise contact of each lead of each IC to be tested with the test head contactor mechanism.

Furthermore, the present test handler provides for the accurate transfer of the ICs from the customer tray to the test tray by means of a "precisor" which accurately orients the IC with respect to the test tray location for which the IC is intended. A pick and place mechanism is utilized for the transfer from the customer tray to the precisor, and then again from the precisor to the intended location in the test tray. Therefore, ICs can be accurately and efficiently processed in batches according to these principles of the present invention.

Furthermore, the test handler of the present invention is able to achieve maximum efficiency by the use of redundant systems. That is, in virtually every facet of the testing sequence of the present invention, a redundant system permits a batch of ICs arranged on a test tray to be waiting for the next test function. Thus, the handler can perform its functions without waiting, thereby maximizing throughput of the ICs.

This redundancy is found in all phases of the present test handler. For example, in that portion of the test handler which receives the cassettes or magazines containing the customer trays, provision is made to receive two magazines at one time. When the first magazine is empty, the handler automatically shifts to the second magazine and begins to remove customer trays therefrom. Likewise, in the loader, a customer tray buffer is provided which permits a tray of ICs to be tested to wait until the ICs can be transferred to the test tray.

Likewise, the loader itself comprises a dual tray load stage which receives two customer trays for pick and place transfer to the precisor and then to the test tray. Thus, as the pick and place empties one customer tray on one of the dual stages of the loader, the pick and place can then immediately begin to work on the second tray while the empty one is replaced. This redundancy maximizes the efficiency of the test handler of the subject invention.

In similar manner, dual test heads are provided which can receive two test trays at one time. Thus, two test trays can be tested at once, or, if desired, a single test tray can undergo one battery of tests in one test head and then be transferred to the second test head for a second battery of tests.

With regard to unloading, two unloaders are provided, each with dual customer tray stages. Furthermore, each unloader is provided with an unloader pick and place which sorts the ICs on the test tray depending upon the test results. Preferably, each pick and place sorts about one-half of the ICs from each test tray before it is transferred to the second pick and place, thereby maximizing throughput of the present invention. As with the loader, the unloader portion is also provided with a buffer which contains an empty tray to facilitate quick replacement with a full tray of sorted ICs.

Finally, much of the work of the loader and unloader is accomplished by a transfer arm, which itself is provided with a dual arm arrangement. Thus, the transfer arm can carry any combination of full or empty customer trays, or partially empty customer trays, in order to maximize its efficiency.

Accordingly, the test handler of the present invention provides for precise and accurate transfer of the ICs from the customer tray to the test tray, and for redundant transfer systems in order to maximize throughput. The improved automatic test handling system comprises a load section for accepting IC devices, pick and place apparatus for moving IC devices to and from customer supplied holders and system test trays, a test area for testing the IC devices and an unload section for distributing groups of tested devices into categories.

DETAILED DESCRIPTION OF THE INVENTION

Figures 1, 1A:
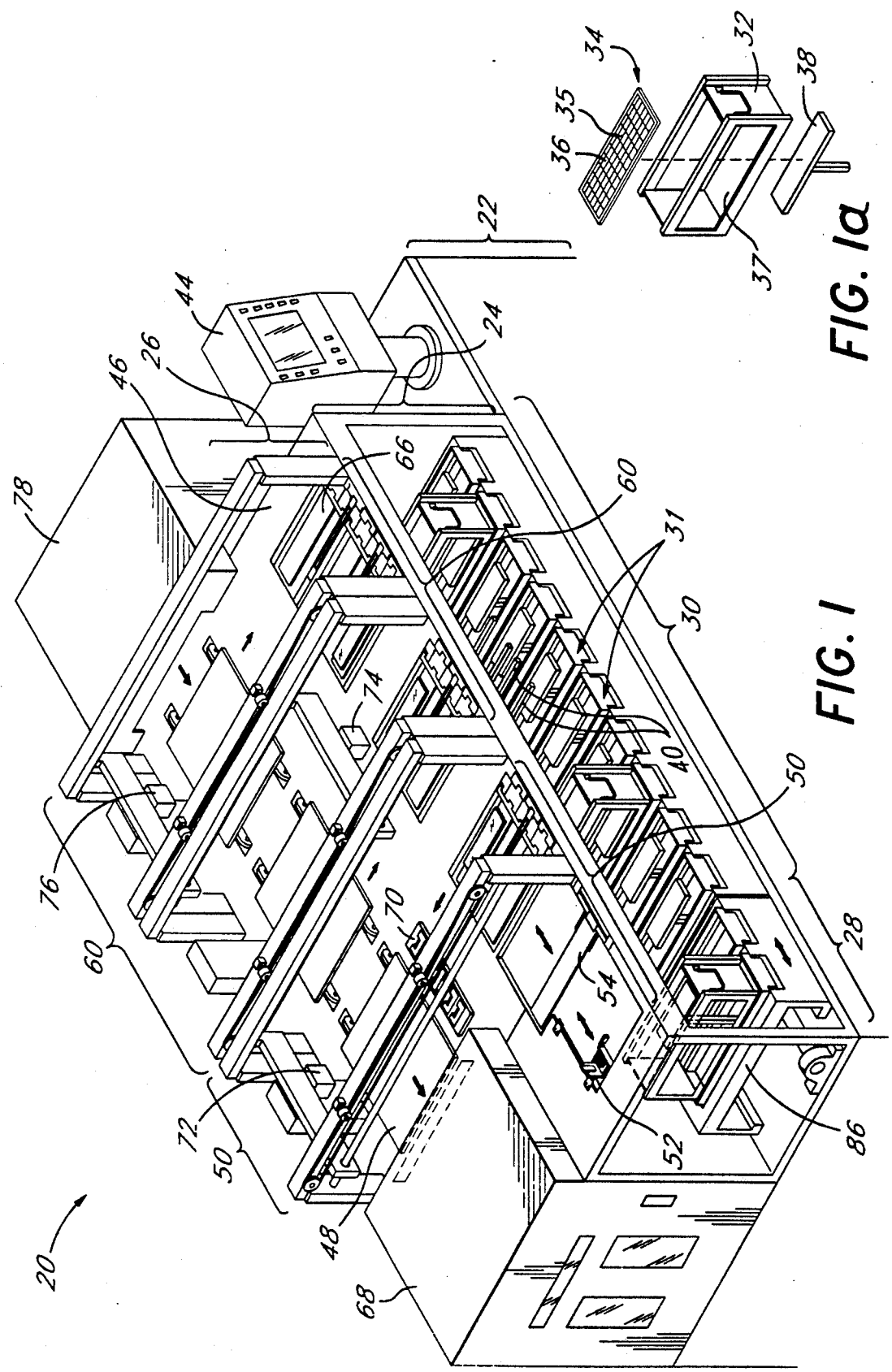
FIG. 1 is a perspective view of the automatic test handler of the present invention illustrating the primary components of the system.
FIG. 1a is an exploded view of a customer tray and tray magazine and tray elevator.
Figure 2:
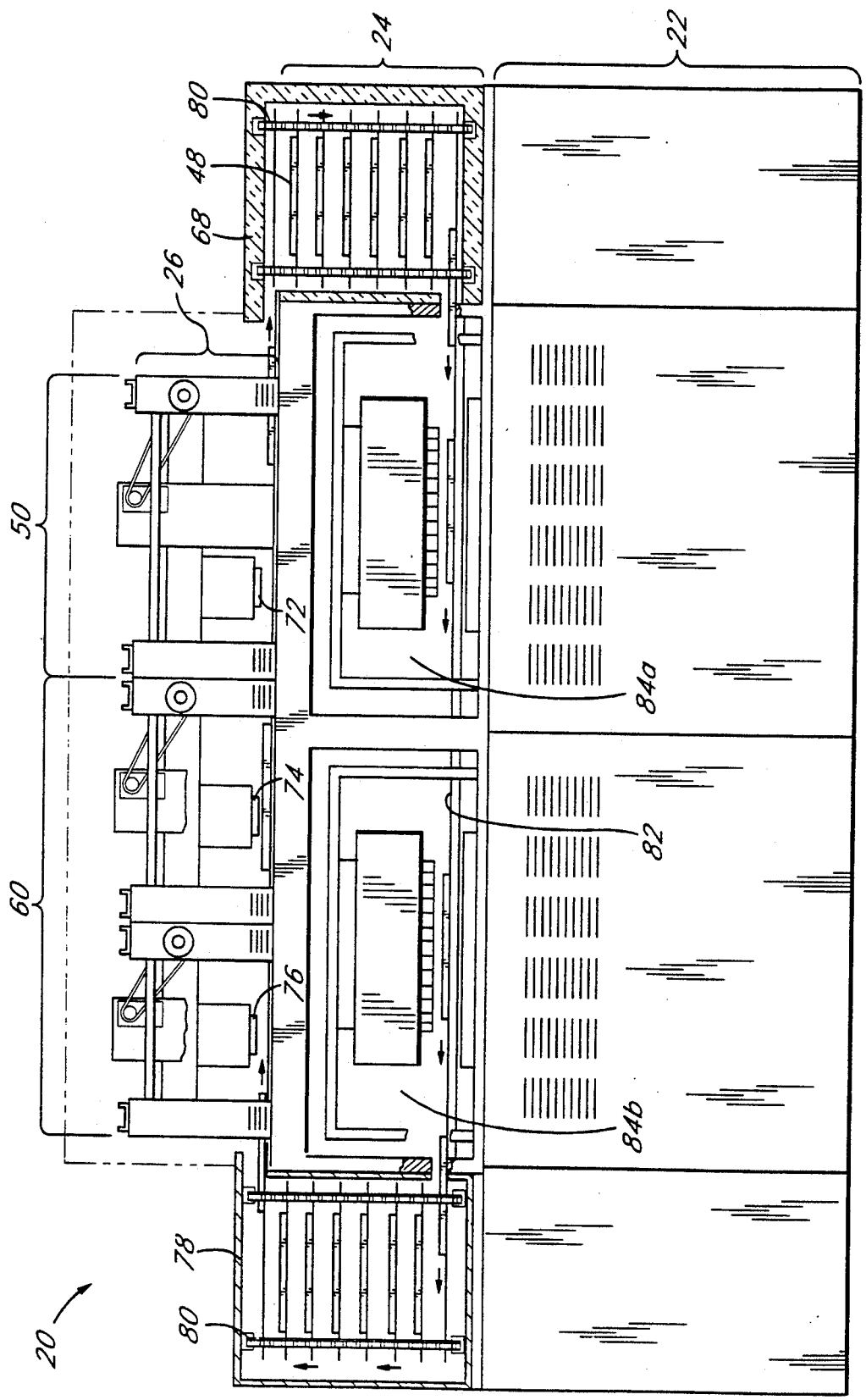
FIG. 2 is a rear elevational view of the automatic test handler of the present invention illustrating primarily the soak chamber, the two test areas, and the unsoak chamber.
Figure 3:
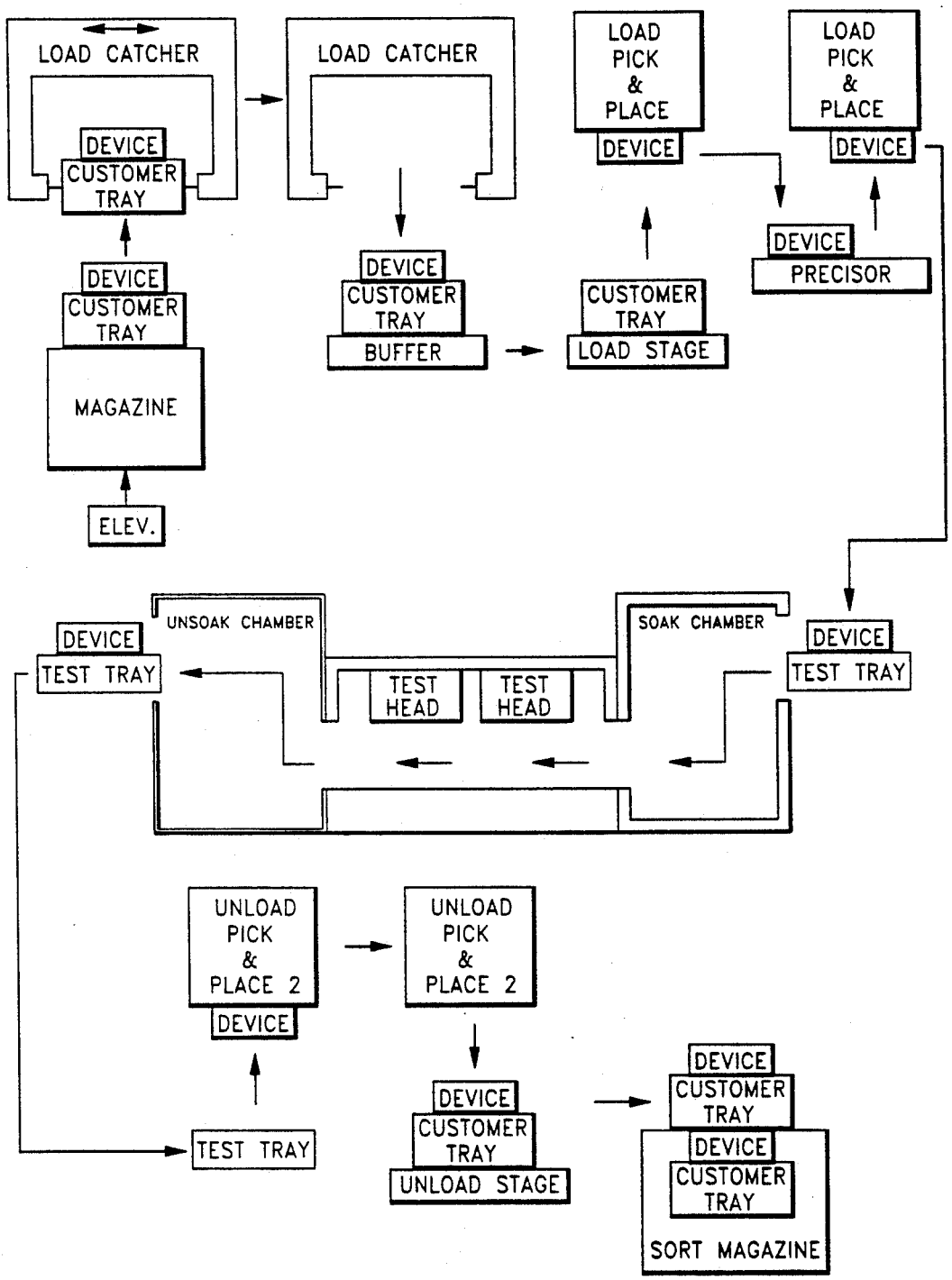
FIG. 3 is a schematic illustrating the overall test handler process steps.

FIGS. 1 and 2 illustrate in a somewhat general manner the principal components of the automatic test handler 20 of the present invention. The schematic illustration of FIG. 3 illustrates the general test method and sequence followed by the test handler 20 of the present invention. Additional detail of the handler and test method will be described below in more detail in connection with FIGS. 4-6. It will be noted that throughout this description, "left" and "right" designations are used with reference to FIG. 4, or as seen from the front of the test handler 20.

Although the present handler and method are described herein in connection with the specific illustrations, the principles of the present invention are not limited to these particular configurations or processes, but can be applied with equal success to handlers of varying configurations utilizing a somewhat different test sequence.

General Description of the Handler

Referring first to FIGS. 1 and 2, the principal components of the test handler 20 of the present invention may be described as follows. The handler 20 is comprised of a lower cabinet 22, a middle portion 24 and an upper portion 26. It will be noted that the lower cabinet 22 is only partially shown in FIG. 1, but completely illustrated in the rear view of FIG. 2. The lower cabinet 22 contains power supply components, electric connections and cables (not shown) which control the function and sequence of the testing operation which occurs primarily in the middle and upper portions 24, 26 of the handler 20.

Referring primarily to FIG. 1, beginning at the front left side of the middle portion 24, there is shown the magazine input area 28 which lies immediately adjacent the magazine output area 30 which encompasses the central and right-hand portions of the front of the middle portion 24 of the handler. These magazine input and output areas comprise a number of stations 31 which receive cassettes or magazines 32 containing a plurality of stacked customer trays 34 having arrayed thereon the ICs 36 to be tested by the handler 20. Such a customer tray magazine 32 and customer tray 34 is shown in the exploded view of FIG. 1a, and will be described in more detail below. For ease of description and illustration, FIG. 1 illustrates only a single customer tray magazine 32 located in the magazine input area 28; however, it will be understood that the various stations of the magazine input and output areas 28 and 30 are each suitable for receiving a similar magazine 32.

Each of the stations 31 of the magazine output area 30 is provided with a customer tray elevator 38 for lifting the customer trays 34 stored within each magazine 32 at the appropriate time. The magazine input area 28 is provided with only a single elevator 38. The two magazines 32 received by the magazine input area 28 contain customer trays 34 having ICs 36 to be tested. The magazine 32 located at each station 31 of the magazine output area 30 receives customer trays 34 of ICs 36 which have already been tested and sorted according to the test results. Thus, in the example shown in FIG. 1, a total of ten stations 31 in the output area 30 are shown. This number of stations would provide, for example, testing of the ICs in accordance with eight different categories, while leaving one station for retest and one station for empty customer trays. However, a wide variety of customer tray input and output configurations are possible in accordance with the principles of the present invention.

Figure 4:
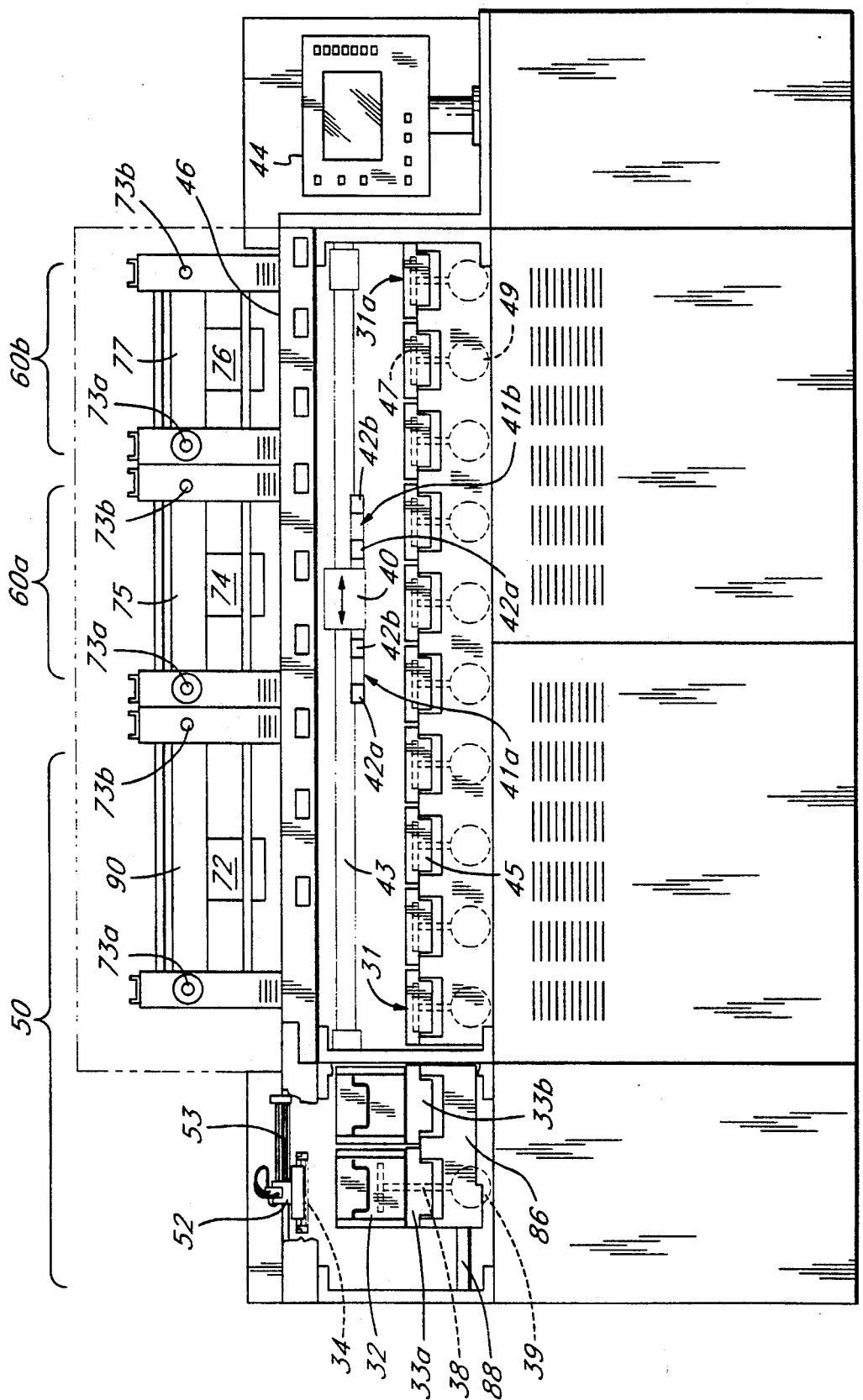
FIG. 4 is a front elevational view of the present test handler illustrating primarily the customer tray magazine input and output areas.

Referring again to the middle portion 24 of the handler 20 shown in FIGS. 1 and 4, a transfer arm 40 having two pair of tray handlers 42 is illustrated in the magazine output area 30. This transfer arm 40 can move laterally as well as up and down, and interacts with the various sections of the handler 20 to perform the bulk of the customer tray transfer work associated with the handler 20. The movements of this transfer arm 40 are very intelligent and are controlled, by means of appropriate software commands from a control module, a display monitor 44 of which is shown on the right-hand side of the middle portion 24 of the handler 20.

The upper portion 26 of the handler 20 comprises primarily an upper surface 46 where the transfer of the ICs 36 from customer trays 34 to test trays 48 and then back again is accomplished. Beginning at the left side of the upper surface 46, there is shown the loader section 50 which comprises a load catcher 52, a customer tray buffer 54 and dual load stages 56a and 56b, arranged side by side on the upper surface 46. Immediately to the right of the loader section 50 is the unloader 60, which handles the sorted ICs 36 after they have undergone testing. The unloader 60 comprises two pair of side by side unloader stages, including unload stage 62a and unload stage 62b, located on the left, and unload stage 64a and unload stage 64b, located to the right side of the upper surface. At the extreme right end of the upper surface 46, there is found an empty customer tray buffer 66 whose purpose and function will be described in more detail below.

Still referring to FIG. 1, a soak chamber 68 is located at the left rear of the middle portion 24 of the handler 20 and extends slightly above the upper surface 46. The soak chamber 68 receives test trays 48 from the upper surface 46. The test tray 48 receives the ICs 36 to be tested from a precisor 70, which in turn receives them from the load stages 56a,b located in the loader section 50. The ICs 36 are transferred from the load stages 56a,b to the precisor 70 and then to the test tray 48 by means of a load pick and place 72 which translates above the upper surface 46 of the handler 20.

Immediately to the right of the load pick and place 72 is a pair of unload pick and place mechanisms, including left unload pick and place 74 and right unload pick and place 76. The unload pick and place mechanisms 74, 76 sort the ICs 36, depending upon the test results, and place them on the unload stages 62, 64 for subsequent transfer to the appropriate category magazines 32 stored in the magazine output area 30 below. The test trays 48 containing the tested ICs 36 arrive at the unload pick and place mechanisms 74, 76 from an unsoak chamber 78 located at the rear right side of the handler 20.

Referring primarily to the rear view of FIG. 2, the soak chamber 68 (now located on the right side of FIG. 2) receives test trays 48 from the upper surface 46 of the handler 20 and gradually lowers them by means of an elevator mechanism 80 to the lower surface 82 of the middle portion 24 of the handler 20. The purpose of the soak chamber 68 is to prepare the ICs 36 for testing by placing them in appropriate temperature and pressure environment. Each test tray 48 is then transferred through two test head chambers 84a,b where each IC device 36 undergoes the desired testing. The test tray 48 then enters the unsoak chamber 78 (located at the left of FIG. 2) where it is gradually elevated to the upper surface 46 of the handler 20 while being returned to ambient conditions. Upon exiting the unsoak chamber 78, each test tray 48 undergoes IC sorting by means of the two unload pick and place mechanisms 74, 76 which are shown adjacent to the load pick and place mechanism 72. As described with respect to the conventional automatic test handler, the automatic test handler 20 is electrically connected to an electronic device test system, for example, an IC tester (not shown) which includes a test signal generator for supplying a test signal to the IC devices through the test tray 48 in the test head chambers 84a,b, and with a signal comparator for analyzing the results of the test. Based on such test results from the IC tester, the electronic devices are transferred by the unload pick and place mechanisms 74 and 76 as above. In other words, the sorting of the IC's is accomplished through the cooperation of the IC tester, the control module 44, and the unload pick and place mechanisms 74 and 76. Thus, the IC tester determines, as a result of the test, the category into which each chip falls ("good" or "defective" and the specific reason for the defect) and the location of each chip which falls into that category. This information (category and location) is then supplied by means of the tester software to the control module. The control module controls the movements of the pick and place mechanisms in accordance with such information which picks up the IC's and transfers them into the customer tray for the appropriate category, thus accomplishing the sorting of the IC's.

Although each of these principal components of the present invention are described in more detail below, several components are also the subject of copending and commonly owned patent applications which are hereby incorporated by reference. For example, the loader/unloader system is the subject of a patent application entitled LOADER AND UNLOADER FOR TEST HANDLER, Ser. No. 803,154, filed Dec. 4, 1991. Furthermore, the loader and unloader pick and place mechanisms are the subject of an application titled PICK AND PLACE FOR TEST HANDLER, Ser. No. 801,875, filed Dec. 3, 1991. Moreover, each test head of the dual chamber testing mechanism is the subject of an application entitled CONTACT MECHANISM FOR AUTOMATIC TEST HANDLER, Ser. No. 801,875, filed Dec. 3, 1991.

General Description of the Test Method

The method of the present invention can be generally described in connection with the schematic illustration of FIG. 3. For convenience and ease of description, the reference numerals used in FIG. 3 correspond structurally to similar portions of the present test handler 20 illustrated in FIGS. 1 and 2 which in turn illustrate the steps of the method generally by means of various arrows shown therein.

With respect to FIG. 3, for ease of description, only a single IC "device" is illustrated; although, it will be understood that multiple IC devices can be handled and tested conveniently and efficiency in accordance with the principles of the present invention. A magazine 32 containing a number of customer trays 34 having placed thereon an IC device 36 to be tested is first loaded into the magazine input area 28. The elevator 38 in the input area 28 pushes up the customer trays 34 until the uppermost customer tray 34 is elevated above the magazine 32. The catcher 52 of the load section 50 then drops down and attaches to the customer tray 34 having the IC device 36 to be tested.

The catcher 52 then transfers the customer tray 34 to the buffer 54 where it awaits its turn to be received by one of the load stages 56a,b. The transfer arm 40 shown in FIGS. 1 and 4 is used to transfer the customer tray 34 from the buffer 54 to one of the load stages 56a,b. The load pick and place 72, by means of suction, then attaches to the IC device 36 to be tested and places it in the precisor 70 which orients the device 36 precisely with respect to the handler 20 and, more particularly, with respect to the test tray 48. The load pick and place 72 then picks up the device 36 again from the precisor 70 and places it in its precise location on the test tray 48.

Subsequent to removal of all the ICs 36 to be tested by the load pick and place 72, empty customer trays are removed from the load stages 56a,b and placed in the empty magazine station 31, preferably at the far right of the magazine output area 30, or on the empty customer tray buffer 66 located at the extreme far right of the unload section 60. This movement and transfer is accomplished by the transfer arm 40.

The test tray 48 is then transferred into the soak chamber 68 where the device 36 undergoes environmental conditioning. The test tray 48 is then transferred to the dual test head chambers 84a,b where the electronic testing actually occurs. The test tray 48 is then elevated through the unsoak chamber 78 and is expelled therefrom under ambient conditions. The handler 20 then transfers the test tray 48 to a position where the right unload pick and place 76 can sort approximately one-half of the tested ICs, placing them in one of the unload stages 64a or 64b. If the IC device 36 in question is not sorted by the right unload pick and place 76 (which will depend upon the sorting hierarchy determined by the handler and explained in more detail below), the test tray 48 is then shifted to a position under the left unload pick and place 74 where all of the remaining IC devices are sorted by the unload pick and place 74 and placed in one of the two unload stages 62a or 62b.

At each of the unload stages 62 or 64, a customer tray 34 is waiting to receive the sorted ICs in accordance with the test results and the desired sort categories. When a customer tray 34 is full or no longer needed for sorting purposes, the transfer arm 40 moves it from the unload stage 62, 64 and places it in the sort magazine 32 located below the upper surface 46 of the handler 20 in the magazine output area 30.

This process then continues with the now empty test tray 48, leaving its position under the left unload pick and place 74 and shifting to a position under the load pick and place 72 to receive more IC devices 36 to be tested.

Detailed Description of the Magazine Input Area

The magazine input area 28 can be described in connection with FIGS. 1 and 1a and the front elevational view of FIG. 4. This component of the present handler comprises a magazine shifter 86 which can receive two customer tray magazines 32 as shown in FIG. 4 and the fixed customer tray elevator 38 shown in dotted lines in FIG. 4. As explained above, the purpose of the magazine input area 28 is to receive magazines 32 containing customer trays 34 having ICs to be tested. These magazines 32 are loaded into the input area 28 by an operator or other robotic means. In this regard, it should be pointed out that robots or other automatic guided vehicles ("AGV") can be used to load customer tray magazines 32 into the input area 28 and remove them from the magazine output area 30. This use of AGVs is facilitated in the present handler by the open structure of the middle portion 24 of the handler 20 where the magazine stations 31 are located.

The magazine shifter 86 comprises a left magazine station 33a and a right magazine station 33b in side by side fashion. FIG. 1a illustrates a typical customer tray magazine 32. It should be noted that the outside dimensions of such customer tray magazines 32 have been standardized so as to be compatible with a wide variety of handlers. However, as noted above, the dimensions and configurations of customer trays 34 which are stored within the magazines 32 have not been standardized and may take on various dimensions or configurations. As shown in FIG. 1a, the magazine 32 is comprised of a rectangular box-like structure into which are stacked vertically, one on top of another, a plurality of customer trays 34. Each tray 34 is inserted into the magazine 32 in a horizontal position and has arrayed on its top surface a number of seats 35, each of which contains an IC 36 to be tested. Thus, each customer tray 34 is open at the top to expose the ICs so that they can be accessed by the pick and place mechanisms of the present handler 20. The load elevator 38, actuated by a stepper motor 39 underneath, pushes the customer trays 34 up through the magazine 32 to be accessed one by one.

The magazines 32 typically have an open frame structure, including open sides to reveal the number of customer trays 34 stacked therein. More importantly, the bottom surface of the magazine is also provided with a large rectangular open space 37 in order to receive the elevator 38 for lifting the customer trays 34 stacked therein, as explained in more detail below.

The magazine shifter 86 is mounted in the input area 28 so as to slide laterally on a rod 88; however, the elevator 38 is fixed so as to be aligned with and underneath the left position of the catcher 52 of the load section 50. The elevator 38 is operated by the stepper motor 39 which causes the elevator 38 to lift customer trays 34 one at a time in a vertical direction out of the top of the customer tray magazine 32 and into position to be received by the load catcher 52.

The load catcher 52 initiates the test sequence of the present invention by grabbing the top customer tray 34 and transferring it to other locations of the handler 20. As each customer tray 34 is grabbed, the elevator 38 lifts another customer tray 34 into position underneath the left position of the catcher 52. When all of the customer trays 34 from the magazine 32 of the left magazine have been emptied, the elevator 38 lowers out of the way and the magazine shifter 86 shifts to the left so that the right magazine station 33b is aligned with and over the elevator 38. The elevator 38 continues to lift customer trays 34 from the right magazine 32 into position with respect to the catcher 52 until all of the customer trays 34 in the right magazine 32 are also emptied. At this point, the handler 20 sounds an alarm which alerts the operator or AGV to replace the two now empty customer tray magazines 32 with two new full customer tray magazines.

This reloading process is as follows. The operator or AGV first loads a full magazine into the right magazine station 33b and then pushes a button (not shown), thereby causing the shifter 86 to shift to the right. The operator or AGV then loads a full magazine 32 into the left magazine station 33a which is now aligned with the catcher 52, as shown in FIG. 4. The shifter 86 and elevator 38 are now ready to empty the customer trays 34 in these magazines 32, one at a time, into the catcher 52. It should be noted that there is no delay experienced by the handler 20 in unloading and loading two customer tray magazines 32 at a time. This is because there are three customer trays 34 already in process when the alarm sounds, namely one tray at the buffer 54 location and two trays at the load stages 56a,b, as described below in more detail.

Detailed Description of the Load Section

The load section 50 of the present handler can be described in more detail in connection with FIG. 1 and the top plan view of FIG. 5. In general, the purpose of the loader 50 is to receive customer trays 34 having ICs 36 to be tested from the input area 28 and to transfer them to the precisor 70 and then to the test tray 48. The loader 50 is assisted greatly in this process by the load pick and place mechanism 72 which is arranged over the upper surface 46 of the handler 20 so as to facilitate access between the loader 50, precisor 70 and test tray 48.

As previously stated, the load section 50 comprises the catcher 52, the buffer 54 and dual load stages 56a and 56b. The catcher oscillates on a horizontal rail 53 between a left position (shown in FIGS. 1 and 5) and a right position (not shown) above the buffer 54. The buffer 54, in turn, also oscillates horizontally on a rail 55 between a left and right position. However, the buffer 54 is shown in FIGS. 1 and 5 in an intermediate position, indicating that it is in transit. Beginning in the left position, the catcher 52 goes down to receive the top customer tray 34, returns to an upper position, and then translates to its right position. The catcher 52 then moves down and deposits the customer tray 34 on the buffer 54 which, at this time, is in its left position. The catcher 52 then returns to its left position in order to catch another customer tray 34. The buffer 54 then moves to its right position and waits for a vacancy at one of the two load stages 56a,b.

Figure 5:
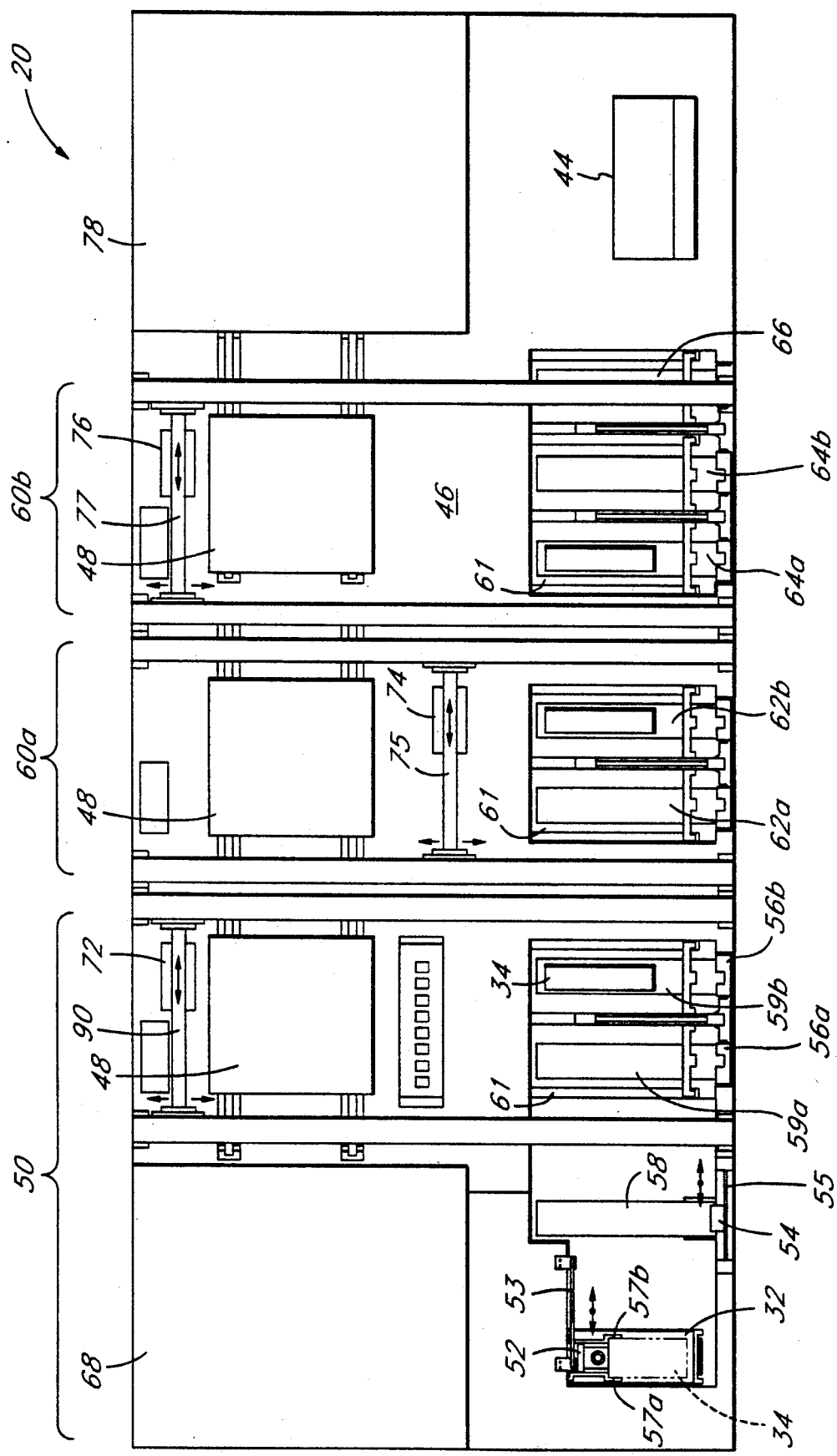
FIG. 5 is a top or plan view of the test handler of the present invention illustrating the loader and unloader sections of the handler, as well as their associated pick and place mechanisms.

The catcher 52 is comprised of a pair of arms 57a,b which straddle the customer tray 34, as shown best in FIG. 5. When the catcher 52 comes into contact with the uppermost customer tray 34, four pins (not shown) are pneumatically activated to extend horizontally in order to engage the bottom of the customer tray 34, thus catching the tray 34 within the catcher 52. This interengagement permits the catcher 52 to translate the tray 34 to its next position on the buffer 54, whereupon the pins are retracted and the tray 34 is released by the catcher 52 and remains by the force of gravity on the buffer 54.

The buffer 54 is comprised of a large horizontal rectangular plate 58 which is mounted in a cantilever fashion at the front of the handler 20. The various movements of the buffer 54, up and down and left and right, as well as those of the catcher 52, are preferably actuated pneumatically; although, other means of movement are well within those of ordinary skill in the art.

The purpose of the buffer 54 is to hold a full customer tray 34 in a readiness condition adjacent the load stages 56a,b, thus permitting the catcher 52 to return to its left position to receive another customer tray 34. If necessary, the operator can replace two empty customer tray magazines 32 with two full tray magazines 32 while the buffer 54 holds a full customer tray 34 waiting to be loaded. Therefor, the loading operation of the present handler 20 can continue while the empty magazines 32 are replaced. Thus, the buffer 54 accomplishes an important purpose of the invention in that it allows the catcher 52 to quickly accomplish its function without delay. The buffer 54 also translates to the right with its full customer tray 34 so as to be in close proximity to the two load stages 56a,b. If there is an empty customer tray 34 located in one of the load stages 56a,b, the transfer arm 40 removes the empty customer tray 34 and replaces it with the full customer tray 34 located on the buffer 54. The buffer 54 then returns to its left position so that it can receive another full customer tray 34 from the catcher 52, and this sequence continues. Thus, the buffer 54 is also a back-up or redundant system to the load stages 56a,b, thus permitting loading to continue even if an empty customer tray 34 is located at one of the load stages 56a,b.

In this regard, it is important to have a good understanding of the function of the transfer arm 40 of the present handler. The transfer arm 40 is a very hard working component of the present handler 20, and can be analogized to a single waitress waiting on ten or twelve tables. The transfer arm 40 is comprised of two pairs of handlers 42a,b, each pair defining a customer tray receptacle 41a,b for receiving a customer tray 34. The transfer arm 40 moves laterally, as well as up and down, as best illustrated in the front elevational view of FIG. 4. Sideways motion is accomplished by movement upon a horizontal rail 43, while up and down movement is accomplished along vertical sliding members (not shown) located at the rear of the transfer arm 40. The pairs of handlers 42a,b of the transfer arm 40 are cantilevered from the rear so as to extend over the magazine output area 30 and beneath the various load/unload stages 56, 62, 64. Each receptacle 41a,b is formed by two pair of pins (not shown), which are also pneumatically actuated, to engage the undersides of customer trays 34 in a manner similar to the catcher 52. Thus, customer trays 34 having various conditions of ICs 36 thereon, or empty customer trays 34, can be held in the receptacles 41a,b, thus minimizing the movement and time of travel incurred by the transfer arm, as explained in more detail below. For example, it is preferable that the transfer arm 40 have one full customer tray 34 so as to be in a position to quickly replace an empty customer tray 34 located at one of the load stages 56a,b. If this is not the case, depending upon test and sort sequence parameters, the transfer arm 40 can quickly obtain a full customer tray 34 at the buffer 54, without traveling longer distances and without incurring more time. In addition, one of the receptacles 41a or 41b can receive the empty customer tray 34 which is then replaced by the full customer tray 34 located in the other receptacle of the transfer arm 40.

Each load stage 56a,b of the loader 50 operates independently of the other to receive the service of the transfer arm 40. Thus, for convenience, only a single load stage 56a will be described. The load stage 56a comprises a large rectangular plate 59a which moves vertically within an opening 61 or window formed in the upper surface 46 of the handler 20. Like the buffer plate 58, the plate 59a of the load stage 56a is cantilevered at the front of the handler 20 and is mounted in sliding relationship on a vertical rail (not shown). Thus, the load stage 56a can move to a down position (not shown) to receive a full customer tray 34 or permit removal of an empty customer tray 34. The load stage 56a can also move up to the upper surface 46 of the handler 20 where the ICs 36 on the customer tray 34 located on the plate 59a are accessible by the load pick and place 72.

The purpose of each load stage 56a,b is to place the customer trays 34 having ICs 36 to be tested in a position proximate to the precisor 70 for immediate transfer to the test tray 48. Thus, the load pick and place 72 is arranged above the upper surface 46 of the handler 20 so as to be over the load stage 56a,b, precisor 70 and test tray 48 which are aligned with one another (see FIG. 5). The load pick and place 72 can move front to back, as well as left and right, in order to remove the ICs 36 from the customer tray 34 located on the load stage 56a,b, place them in the precisor 70, and then pick them up again for transfer to the test tray 48. Two stepper motors (not shown) located at the rear of the test handler 20 actuate the horizontal movement of the load pick and place 72 via pulleys, belts and shafts (not shown), in a manner not unlike the pen movement in an X-Y plotter. The load pick and place 72 is mounted for horizontal movement along two rails 73a,b running front to back and above the upper surface 46 of the handler 20, and is also mounted for left and right movement on a horizontal bar 90 which travels along the front to back rails 73a,b.

Preferably, the load pick and place 72 is provided with eight pick-ups (not shown); however, other numbers and arrangements are possible. The pick-ups are adjustable relative to each other in the left and right direction to change spacing between the IC devices 36 when being transferred between the customer tray 34, precisor 70 and test tray 48. The adjustment means comprises one or more pantograph mechanisms for distributing linear movement from one end, in increasing proportions toward the other end, to points along each mechanism. The precisor 70 is also provided with preferably eight cavities 71 comprised of sloping side wall chambers. Thus, when the load pick and place mechanism 72 drops an IC 36 to be tested into a cavity 71 of the precisor, it falls by force of gravity to the bottom of the cavity 71 where it becomes precisely oriented with respect to the handler 20.

As noted above, customer trays 34 come in a variety of configurations and may contain rows of ICs 36 having four, six or ten ICs in each row. The load pick and place 72 will work on one customer tray 34 at a single load stage 56a at a time, and empty that one before moving to the second load stage 56b. Thus, if customer trays 34 having four ICs 36 in a row are located at the load stage 56a, the load pick and place 72 can pick up two rows at a time and transfer them to the precisor 70. If the customer tray 34 has six ICs in a row, the load pick and place 72 can pick up one row and two devices from the second row, and so on. Since there is no sorting necessary at the load stage 56a, the load pick and place 72 can work quickly and efficiently to precise the ICs 36 and place them into the test tray 48. Once the load pick and place 72 has emptied one customer tray 34 at one load stage position 56a, it will then move laterally to the adjacent load stage 56b and continue its loading function. Thus, an important advantage of the loader 20 of the present invention is the redundant load stages 56a,b which permit the handler 20 to continue working without delay. In other words, while the load pick and place 72 continues to load ICs 36 from the second customer tray load stage 56b, the transfer arm 40 can remove the empty customer tray 34 by placing it in one receptacle 41a and then placing a full customer tray 34 in the load stage 56a so that it is ready for loading when the load pick and place 72 finishes the second customer tray 34.

Typically, the transfer arm 40 has time to replace the empty customer tray 34 with a full one while the second load stage 56b is being loaded. This is especially true if the transfer arm 40 has a full tray already located in one receptacle 41a. However, even if not, the buffer 54 is located in close proximity to the load stages 56a,b as explained above, thus shortening the travel distance and time required for the transfer arm 40 to pick up a full customer tray 34.

Unless called to perform another task, the transfer arm 40 then moves laterally to the buffer 54 and retrieves another full customer tray 34. The transfer arm 40 then moves laterally to the right to place the empty customer tray 34 in the empty station magazine 31a or the unload buffer 66.

Detailed Description of the Unload Section

The unload section 60 of the present handler 20 may be described in more detail in connection with FIG. 1 and the top plan view of FIG. 5. In general, the purpose of the unloader 60 is to sort the ICs 36 which have undergone testing from their respective test tray 48 after exiting the unsoak chamber 78 and to place them in customer trays 34 located at the various unload stages 62, 64 for subsequent transfer to the magazine output area 30. The customer trays 34 from the unload stages 62, 64 are placed in the appropriate magazine station 31 in accordance with the desired sort categories. The unloader 60 of the present handler 20 is greatly assisted in these tasks by the dual unload pick and place mechanisms 74, 76 and, of course, the transfer arm 40.

The unloader 60 comprises four independent unload stages 62a,b and 64a,b arranged in two pair in side-by-side fashion, as best illustrated in FIG. 5. Unloader 60a is located to the right of the loader section 50 and comprises unload stages 62a and 62b. Unloader 60b is located to the right of unloader 60a and comprises unload stages 64a and 64b. To the right of unload stage 64b is located the unload buffer 66 which conveniently holds an empty customer tray 34 to facilitate the sorting process.

The unloader 60a is serviced by the left unload pick and place 74 which is aligned in front to back fashion with unload stages 62a and 62b. Likewise, unloader 60b is serviced by the right unload pick and place 76 which is also aligned with an appropriate test tray 48 and unload stages 64a and 64b, as shown in FIG. 5. Each unload pick and place 74, 76 operates in a manner similar to the load pick and place 72. That is, each is mounted for horizontal movement along two rails 73a,b running front to back and above the upper surface 46 of the handler. The unload pick and place apparatus 74, 76 are also mounted for left and right movement on horizontal bars 75, 77, respectively, which travel along the front to back rails 73a,b. Each pick and place unit 74, 76 is preferably mounted with four pick-ups (not shown) which can move up and down to pick up the ICs 36 and transfer them from the test tray 48 to a customer tray 34 located at one of the unload stages 62, 64.

Each unload stage 62, 64 operates in a manner similar to the load stages 56a,b and to each other. For convenience, only the operation of the unload stages 64a and 64b will be described herein. As a test tray 48 emerges from the unsoak chamber 78, it stops first at unloader 60b where approximately one-half of the IC devices 36 contained thereon are sorted by the unload pick and place 76. As we explain in more detail below, the test tray 48 is then shifted to unloader 60a where the remaining approximately one-half of the ICs 36 are sorted by the unload pick and place 74. As the test tray 48 arrives at unloader 60b, two empty customer trays 34 will already be positioned at unload stages 64a and 64b, and an empty customer tray 34 will be found at the unload buffer 66. The control module is aware of the results of the test and the category into which each IC 36 on the test tray 48 falls. Thus, the sorting of the ICs 36 can begin immediately. The unload pick and place 76 begins to sort a first category of ICs 36 by picking them up row by row from the test tray 48 and transferring them to a first customer tray 34 located at one of the unload stages, either 64a or 64b. The unload pick and place 76 attempts to fill one customer tray first before beginning to fill a second customer tray.

Thus, for example, if the customer tray 34 at unload stage 64a is full, the unload pick and place 76 then begins to fill the customer tray 34 located at unload stage 64b. While the latter customer tray 34 is being filled, the transfer arm 40 removes the full customer tray 34 from the unload stage 64a and replaces it with an empty tray 34. The empty tray can be obtained from the unload buffer 66 which is very near the unload stages 64a,b. Thus, in a fashion similar to the load buffer 54, the unload buffer 66 holds an empty customer tray 34 in a location proximate to the unload stages 62, 64, thus reducing the travel distance and time required for movement of the transfer arm 40. In the alternative, an empty customer tray 34 can be obtained from the empty customer tray station 31a located at the magazine output area 30 below the unload stages 62, 64.

The full customer tray 34 removed from unload stage 64a is then transferred by the transfer arm 40 to the appropriate customer tray magazine station 31 in the magazine output area 30. This station 31 will depend upon which category corresponds with the sorted ICs 36 placed on that customer tray 34.

Many times, the ICs 36 to be sorted from the test tray 48 which fall into a particular category are insufficient to fill the entire customer tray 34. When sorting for that particular category is completed, the partially full customer tray 34 is returned by the transfer arm 40 to the corresponding customer tray magazine station 31 in the magazine output area 30. When that category is to be sorted from a subsequent test tray 48, the transfer arm 40 retrieves the partially full customer tray 34 from the appropriate magazine station 31 and replaces it at one of the unload stages 62, 64. The software for the control module keeps precise count of the number of devices 36 placed in each customer tray 34, even if the tray 34 is partially filled in several stages. When the customer tray for that category is full, it is returned by the transfer arm 40 to the magazine 32 and stocked therein. Subsequent sorting of ICs 36 for that category will begin with an empty customer tray 34.

When the sorting from the test tray 48 at unloader 60b is completed, the test tray 48 shifts to unloader 60a, where the remainder of the ICs 36 are removed from the test tray 48. The empty test tray 48 then shifts to the loader 50 so as to be adjacent the precisor 70. It should be noted that with each shift, three test trays 48 located on the upper surface 46 of the handler 20 move at the same time. That is, the test tray 48 at the loader 50 moves into the soak chamber 68, the test tray 48 from unloader 60a moves to the loader 50 position, and the test tray 48 from unloader 60b moves to unloader 60a. At the same time, a test tray 48 in the unsoak chamber 78 emerges to fill the vacancy at unloader 60b. Thus, testing and sorting can continue without delay or interruption. This sequential testing procedure requires that trays 48 be continuously transferred from each stage of the handler 20 to the next. Of course, during a finite test phase, the continuous operation will only be possible after a number of test trays 48 have been processed at the start up until the last test tray 48 has been loaded at the end.

Furthermore, the same advantages of redundancy and resultant efficiency seen in the load arena 50 are very evident in the unload section 60 of the present handler 20. Since sorting of the tested ICs 36 requires more time than the simple loading of untested ICs, dual unloaders 60a,b, including corresponding pick and place mechanisms 74, 76, are provided to accelerate this process. Likewise, dual unload stages 62, 64 are also provided so that sorting can continue even when one customer tray 34 is full. An empty tray buffer 66 is also provided to facilitate the sorting process and to reduce the amount of travel required by the transfer arm 40. Thus, the present handler is able to maximize the throughput of tested ICs.

Detailed Description of the Magazine Output Area 30

The magazine output area 30 can be described in detail in connection with FIG. 1 and the front elevational view of FIG. 4. In general, the purpose of this portion of the handler 20 is to contain a number of customer tray magazines 32 at each of its stations 31 and to receive customer trays 34 from the unload stages 62, 64 according to the IC test results. Initially, each magazine 32 is empty. As the sorting of the tested ICs continues, the magazines 32 will receive either completely or partially full customer trays 34 of sorted ICs 36. Each magazine station 31 corresponds to a sort category. Thus, in a particular test, the number of stations 31 containing customer tray magazines 32 may vary. Typically, four or eight test categories are desired. One category, of course, would be the acceptable or good ICs. Other sort categories would relate to defects in the tested ICs of a particular kind. The identification of particular types of defects by the present handler 20 aids the manufacturer in correcting these defects.

In the example shown in FIG. 4, a total of ten customer tray magazine stations 31 are illustrated. Although various other configurations and station numbers are possible, this example allows for eight sort categories, one station for ICs to be retested and one station 31a to simply store empty customer trays 34 for use by the transfer arm 40.

Each station 31 of the magazine output area 30 comprises a magazine platform 45 which is affixed with respect to the handler. The platform 45 is situated above a customer tray elevator 47 which is operated by a stepper motor 49. With the magazine 32 on the platform 45 in each station 31, the elevator 47 is initially in the raised position as shown in FIG. 1. This is because the magazine 32 is initially empty. When it receives a customer tray 34 from one of the unload stages 62, 64 by means of the transfer arm 40, the elevator 47 keeps the customer tray 34 in an elevated position. Thus, if the tray 34 is only partially full, the transfer arm 40 may have to retrieve it for sorting from a subsequent test tray 48. Thus, by maintaining the partially full customer tray 34 in an elevated position, the transfer time is reduced.

When the magazine 32 receives a full customer tray 34, it is "stocked" in the magazine 32 by means of the elevator 47. That is, the elevator 47 is lowered one step by the stepper motor 49. A subsequent customer tray 34 can then be placed on top of the stocked customer tray.

Eventually, the magazine 32 at each station 31 may become full of customer trays 34. At that time, the handler 20 will sound an alarm and the operator or other AGV will replace the full magazine with an empty magazine 32. Thus, sorting can continue without delay.

Detailed Description of the Operation of the Handler

The operation and method of the present invention can be described in more detail in connection with the schematic view of FIG. 6, which illustrates the magazine input area 28, the load section 50, the unload section 60 and the magazine output area 30 from a somewhat front elevational point of view. It will be understood that the movements of the present handler 20 are controlled and directed by the control module. In particular, the mechanical movements of the various devices and mechanisms of the present handler 20, including the loading and unloading logic and sequencing, are directed by the software utilized by the control module. Once these features of the present invention are understood, the writing of such software is within the abilities of one of ordinary skill in the art. Furthermore, the mechanical movements of the various mechanisms and devices can be actuated pneumatically, electrically or by other means, as it will be apparent to one of ordinary skill.

The operation of the present handler 20, which allows it to achieve enhanced efficiency and productivity, can be broken down into two facets, loading and unloading. The loading phase includes the input of magazines 32 containing full customer trays 34 into the system, and the unloading phase includes the sorting of tested ICs 36 and the refilling of magazines 32 with customer trays 34 containing assorted ICs 36 in accordance with the test results.

Thus, an important feature of the present invention is that both loading and unloading can occur simultaneously without significant delay. In addition, both phases are interactively assisted by means of a single transfer arm 40 having dual customer tray receptacles 41a,b. Moreover, as illustrated in FIG. 4 or the schematic view of FIG. 6, the transfer arm 40 is arranged geographically in a compact fashion so as to be efficiently located near the load 56 and unload stages 62, 64, as well as the magazine output area 30. This compact arrangement reduces travel distance and the time required for the transfer arm 40 to move such distances.

Thus, during loading, as well as unloading, the transfer arm 40 may receive a number of service "calls" from various locations of the handler 20. In order to reduce the amount of movement in the transfer arm 40, the software of the control module will attempt to accomplish more than one function on each of the transfer arm trips. For example, if called to pick up a customer tray 34, the handler 20 will attempt to cause the transfer arm 40 to deposit another customer tray 34 that may be found in its other receptacle 41a,b on the same trip, preferably in the vicinity of the requested pick-up location. In other words, on a trip to the loader section 50, the transfer arm 40 may perform a loading function and at the same time deposit a full customer tray 34 into one of the magazine stations 31 located at the left of the magazine output area 30, which is adjacent the load section 50.

Figure 6:
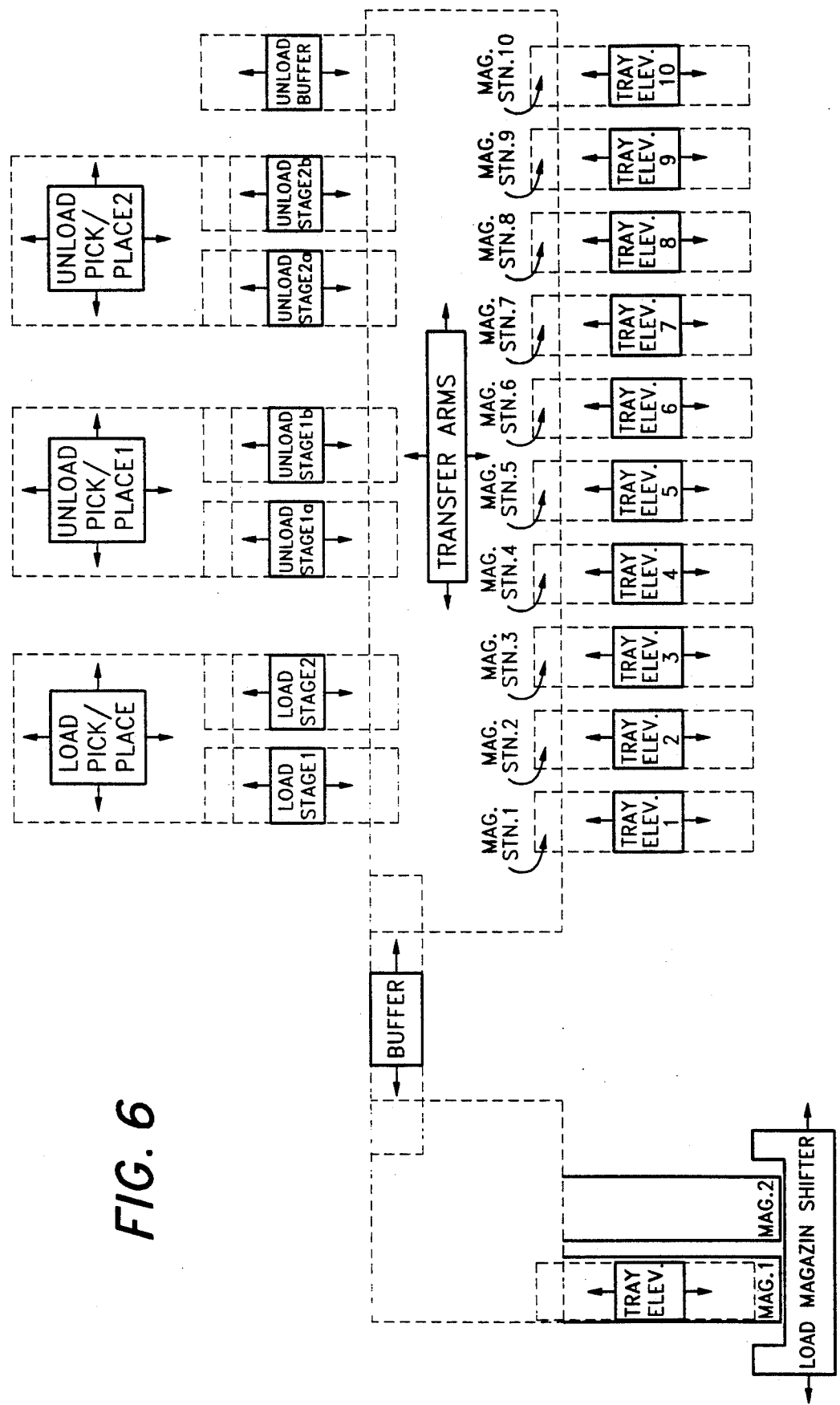
FIG. 6 is a schematic representation of the spatial relationship between components in the loader and unloader section.

The operation of the present handler 20 can best be illustrated by means of an actual example, and with reference to FIGS. 5 and 6. With the handler 20 initialized for testing, two customer tray magazines 32 are loaded into the shifter 86 in the magazine input area 28. The process begins with the elevator 38 lifting the customer trays 34 in the magazine 32 on the left of the shifter 86 so that the uppermost customer tray 34 is elevated slightly above the magazine 32. The catcher 52 then grabs the top customer tray 34 and translates to the right, as illustrated in FIG. 6, and deposits the customer tray 34 on the buffer 54 which is in its leftmost position. The buffer 54 then translates to the right to its rightmost position where the transfer arm 40 receives the customer tray 34 and transfers it to load stage 56a. The load pick and place 72 then begins to pick up the IC devices 36 in the customer tray 34, transfer them to the precisor 70, and then pick them up again and transfer them to an empty test tray 48 which is waiting in the load position. In the meantime, the catcher 52 has returned to pick up another customer tray 34 and transfer it to the buffer 54, which in turn transfers it to the transfer arm 40 for placement at load stage 56b. This loading can proceed continuously without interruption due to the redundancy advantages of the present invention as evident in the magazine shifter 86, the catcher 52, the buffer 54 and the dual load stages 56a,b. Since all of the ICs 36 are treated alike in the load section 50, this phase of the test sequence can occur expeditiously.

This process then continues until all of the seats in the test tray 48 of the present example are full. At this point, the test tray 48 shift occurs wherein this first test tray enters the soak chamber 68 and an empty test tray which was previously in the unloader 60a position transfers to the load position to begin loading. The first test tray 48 eventually travels through the soak chamber 68 and into the first test head chamber 84a where the IC devices 36 loaded thereon undergo a battery of tests.

Upon exiting the second test head chamber 84b, the test tray 48 of this example enters the unsoak chamber 78 and eventually rises to the upper surface 46 of the handler 20. Upon undergoing another shift, this first test tray 48 emerges from the unsoak chamber 78 and arrives at the unloader 60b position at the rear right side of the upper surface 46 of the handler 20, as shown in FIG. 5. The ICs 36 on the test tray 48 are now ready for sorting in accordance with the test results.

The sorting of tested ICs can be more time consuming because not all of the ICs are handled the same, as they are in the load section 50. That is, the ICs which fall into various test categories are scattered randomly throughout the test tray 48 and are found in varying quantities. Thus, sorting tested ICs inherently requires additional mechanical movement and more time. However, with the structure and sequence of the present handler 20, this time is minimized so as to keep pace with the load section 50, thereby increasing the productivity of the present handler 20. This is accomplished primarily by means of dual unloaders 60a,b which each sort approximately one-half of the ICs on each test tray 48 passing through it. Thus, working together, the dual unloaders 60a,b can each sort approximately one-half of the ICs on each test tray 48 in the time that it takes to load a single test tray 48. If this can be accomplished, there is no delay in processing and the throughput of the devices 36 increases. That is, because the test tray shift involves the movement of all three test trays 48 on the upper surface 46 at a time, if a single tray is delayed in either of the unload positions 60a,b, then all three trays are delayed.

Returning to the example of the first test tray 48, such trays typically contain sixty-four ICs 36. The majority of the tested ICs fall into the acceptable or "good" category with lesser quantities falling into the other categories defining some form of defect in the IC. For ease of description, it will be assumed that the ICs of test tray 1 have been tested for four categories. In a typical example, fifty-three ICs will be good, and thus fall into category 1. Six ICs may have one form of defect and will fall into the category defined as category 2. Three ICs will have a second type of defect and will fall into category 3, while two ICs will have a third type of defect and will be designated for category 4. It will be understood that the present handler 20 can process ICs in accordance with a wide variety of categories and test results, and that the following is merely one example of the sorting capabilities of the present handler 20.

The control module is aware not only of the categories into which the sixty-four ICs 36 of the test tray 48 fall, but also their locations. In accordance with the sort logic, as explained above, it is preferable that unloader 60b sorts approximately one-half of the sixty-four ICs while unloader 60a sorts the remaining one-half. It is also preferable that small quantity categories be sorted at each unloader position and be sorted first, prior to the larger quantity categories (which in this example is category 1).

Thus, in this example, the control module determines that twenty-six of the fifty-three ICs falling into category 1, and all six of the ICs falling into category 2, should be sorted by unloader 60b. Likewise, the control module determines that the remaining twenty-seven ICs falling into category 1, all three of the ICs in category 3 and both of the ICs in category 4 should be sorted by unloader 60a. Advantageously, this means that unloader 60b will sort a total of thirty-two ICs, while unloader 60a will sort an equal number. In general, the control module will split the unloading chores between the two unloaders 60a,b so that an equal amount of time is spent by each. This sorting sequence results in maximum efficiency. This may result in an equal number of ICs will be sorted by each, as above, or, alternatively may result in an equal number of sort categories handled by each. Whatever the allocation of duties, the logic of the control module software is capable of calculating the most equitable time division spent by each unloader 60a,b when processing any particular test tray 48.

With the test tray 48 in the unloader 60b position, the unload pick and place 76 will first sort the six ICs from category 2 and load them into a customer tray 34 found at unload stage 64a. The unload pick and place 76 will then begin to sort the twenty-six ICs falling into category 1, placing them into the empty customer tray 34 found at unload stage 64b. While this sorting into unload stage 64b occurs, the transfer arm 40 first removes the customer tray 34 from unload stage 64a which contains the six category 2 ICs. The transfer arm 40 then replaces this customer tray 34 with an empty customer tray and reloads the unload stage 64a. Depending upon the priority of other service calls, the transfer arm 40 will then put the category 2 customer tray 34 into the category 2 magazine station 31 at the left of the magazine output area 30. Thus, as noted above, it is preferable to sort the smaller quantity categories first so that the larger number categories can be sorted more rapidly. Since the changing of customer trays 34 is time consuming, the transfer arm 40 can be performing this function while the unload pick and place 76 sorts the large number categories. Because of the redundancy of the twin unload stages 64a,b, the large number categories can be sorted rapidly without delay. Thus, the transfer arm 40 has time to replace a smaller quantity customer tray 34, in this case category 2 customer tray, into the appropriate magazine station 31, and return to the unloader 60b before both of the customer trays 34 and unload stages 64a and 64b are full with the larger quantity IC categories. Thus, again, there is no delay in the sorting capabilities of the present handler 20.

While in the vicinity of the category 2 magazine station 31, which is near the left end of the magazine output area 30, the transfer arm 40 may receive a call, or may have previously received a call, from the loader 50. Thus, in order to minimize travel time, the transfer arm 40 will perform the necessary function in the vicinity of the loader 50 (for example, transferring a full customer tray 34 to one of the load stages 56a,b) before returning to the sorting occurring at one of the unload 60a,b positions.

Returning to the present example, when the customer tray 34 at unload stage 64b is full, the unload pick and place 76 will immediately continue sorting the twenty-six category 1 ICs into the empty customer tray 34 waiting at unload stage 64a. The transfer arm 40 then removes the full customer tray 34 at unload stage 64b, replaces it with an empty customer tray (which it may have previously retained in one receptacle 41a,b or which may be obtained from the unload buffer 66 located to the right of unload stage 64b), and transfers the full customer tray 34 to the category 1 magazine. Again, the transfer arm 40 will attempt, as directed by the control module, to perform other functions on this trip or on its return in order to minimize movement.

When all twenty-six of the category 1 ICs to be sorted by the unloader 60b have been thus sorted, the test tray shift occurs which transfers the test tray of the present example to unloader 60a. In this location, the remaining twenty-seven category 1 ICs are to be sorted, along with the three category 3 ICs and the two category 4 ICs. However, as explained above, the two category 4 ICs will first be sorted by unload pick and place 74 and loaded into the customer tray 34 waiting at unload stage 62a. The transfer arm 40 then removes this customer tray 34 and replaces it with an empty tray, at the same time that the unload pick and place 74 is loading the three category 3 ICs into the empty customer tray 34 at unload stage 62b.

These two sorts, because of their reduced quantity, do not require a great deal of time. However, as soon as completed, the unload pick and place 74 can immediately begin to sort the larger quantity twenty-seven category 1 ICs into the empty customer tray 34 waiting at unload stage 62a. In the meantime, the transfer arm 40 can transfer the partially full category 3 and category 4 customer trays to their appropriate magazine stations 31. When all twenty-seven category 1 ICs have been sorted by the unload pick and place 74, the test tray 48 of the present example should be empty and ready for the shift into the load pick and place 72 position.

In future sorting, the partially full customer trays 34 must be returned by the transfer arm 40 to the appropriate unload stages 62, 64 to receive additional numbers of lower quantity category ICs 36. Again, however, this is performed by the transfer arm 40 in an efficient manner while it is performing other movements.

In conclusion, it is submitted that the handler 20 of the present invention represents a substantial improvement in IC testing and handling.

What is claimed is:

1. An automatic test handler using test trays and customer trays for testing integrated circuits ("ICs") arranged on said test trays and received by said test handler in magazines containing a plurality of said customer trays, the handler comprising:

a magazine input area for receiving at least one magazine containing said customer trays and having arranged on said customer trays said ICs to be tested;

a loader for transferring said customer trays from said magazines to a position for access to said ICs to be tested;

a loop-like path formed in said test handler for circulating said test trays therethrough;

a first pick and place mechanism for transferring said ICs to be tested from said customer trays at said position to said test trays;

at least one test chamber arranged in said loop-like path for receiving said test trays and for testing said ICs arranged thereon;

a second pick and place mechanism for transferring said ICs following testing from said test trays to said customer trays in accordance with the results of said testing; and an unloader for transferring said customer trays containing said ICs which have been tested and returning said customer trays to magazines arranged in said unloader in accordance with the test results.

2. The automatic test handler of claim 1, wherein said magazine input area comprises a magazine station for receiving at least two magazines, and further comprising an elevator for causing said customer trays contained in said magazines to be expelled from said magazines one at a time, whereby said station can reciprocate between left and right positions so that both of said magazines are accessible by said elevator.

3. The automatic test handler of claim 1, wherein said loader comprises a tray catcher for catching said customer trays from said magazines, a buffer for receiving said customer trays transferred by said tray catcher, and a pair of load stages for positioning said customer trays received from said buffer at said position for access in said loader.

4. The automatic test handler of claim 1, wherein said test chamber comprises a plurality of test heads for simultaneous testing two or more of said ICs on said test trays.

5. The automatic test handler of claim 1, wherein said second pick and place mechanism comprises a plurality of pick and place mechanisms each simultaneously transferring approximately the same amount of said ICs on said test tray following said testing.

6. The automatic test handler of claim 1, wherein said unloader comprises four unload stages for positioning emptied customer trays transferred from said loader, said unload stages being arranged in two pair each in side by side fashion.

7. The automatic test handler of claim 1, further comprising a precisor arranged between said loader and said test trays for precisely aligning said ICs in said test trays for testing.

8. The automatic test handler of claim 1, further comprising a soak chamber for providing a predetermined temperature change to said ICs to be tested and an unsoak chamber for providing a temperature change to said tested ICs so that said tested ICs are returned to room temperature.

9. The automatic test handler of claim 8, wherein said soak chamber and said unsoak chamber are arranged in said loop-like path with said test chamber in between.

10. The automatic test handler of claim 8, wherein said soak chamber and said unsoak chamber comprising elevators which transfer said test trays in a vertical direction within said chambers.

11. An automatic test handler for simultaneously testing a plurality of electronic devices arranged on customer trays which are in turn arranged in loader magazines and for returning said customer trays having said electronic devices that have been tested to unloader magazines, said automatic test handler comprising:

a loader for transferring said customer trays from said magazines to a load stage for access to said devices to be tested;

a first pick and place mechanism for transferring said devices from said customer trays at said load stage to a plurality of test trays;

a test chamber for testing said electronic devices aligned on said test trays;

a second pick and place mechanism for transferring said electronic devices from said test trays and returning them to said customer trays in accordance with the results of said testing; and an unloader for transferring said customer trays containing said electronic devices to said unloader magazines in accordance with the test results.

12. An automatic test handler for receiving a plurality of electronic devices arranged on a first type of tray and for simultaneously testing said electronic devices aligned on a second type of tray, wherein said electronic devices are transferred between said first type of tray and said second type of tray, said automatic test handler comprising:

a tray path for circulating a plurality of said second type of tray having said electronic devices received from said first type of tray and testing said electronic devices by a test chamber provided in said tray path, said second type of tray arranged in sequence in said tray path;

a loader for receiving said first type of tray in sequence and for transferring said first type of tray to a location adjacent said tray path;

a first transfer mechanism for removing said electronic devices from said first type of tray and transferring said devices to said second type of tray prior to testing by said test chamber; and a second transfer mechanism for removing said devices from said said second type of tray and returning said devices to said first type of tray following said testing in accordance with the results of said testing.

13. The automatic test handler of claim 12, further comprising a precisor for allowing said devices to be accurately placed within said second type of tray.

14. The automatic test handler of claim 12, wherein said tray path defines a plane in which said second type of tray circulates within said tray path defining said plane.

15. The automatic test handler of claim 14, wherein either of said first or second transfer mechanism transfers said devices to said tray path in a direction which intersects said plane defined by said tray path.

16. The automatic test handler of claim 12, wherein said plurality of said second type of tray circulating in said tray path moves within said tray path substantially simultaneously.

17. The automatic test handler of claim 12, wherein said second transfer mechanism comprises a plurality of transfer mechanisms, whereby said removing and returning said devices is expedited.

18. The automatic test handler of claim 17, wherein each of said plurality of transfer mechanism removes approximately the same number of said devices from said second type of tray.

19. The automatic test handler of claim 12, wherein each of said transfer mechanisms comprises a pair of stages for receiving said first type of tray and a pick and place mechanism for retrieving and placing said electronic devices between said first type of tray and said second type of tray.

20. An automatic test handler for testing a plurality of electronic devices arranged on test trays wherein said electronic devices are first arranged on customer trays and received by said handler in magazines and transferred to said test trays from said customer trays, said handler comprising:
- a first horizontal plane wherein said test trays and said customer trays are placed on said plane for transferring said electronic devices between said customer trays and said test trays for testing and sorting;
- a second horizontal plane wherein a magazine input area for receiving said magazines containing said customer trays having said devices to be tested and a magazine output area for receiving said magazines containing said customer trays having said devices which have been tested are arranged based on the test results; and
- a third horizontal plane having a test head for testing a plurality of said devices provided from a horizontal direction.

21. The automatic test handler of claim 20, wherein said first and second planes are arranged substantially vertically and wherein said transferring said electronic devices between said customer trays and said test trays is performed at an area substantially directly above said magazine input and output areas.

22. The automatic test handler of claim 20, further comprising a transfer arm situated between said magazine input area and said magazine output are for transfer said customer trays between said magazine input area and said magazine output area.

23. The automatic test handler of claim 20, wherein said magazine input area is adjacent an area for transferring said electronic devices between said customer trays and said test trays.

24. The automatic test handler of claim 20, wherein each of said areas is provided with a redundant system for handling at least two of said test trays having devices arranged thereon for testing.

* * * * *

UNITED STATES PATENT AND TRADEMARK OFFICE
CERTIFICATE OF CORRECTION

PATENT NO. : 5,313,156
DATED : May 17, 1994
INVENTOR(S) : Mark W. Klug, et al.

It is certified that error appears in the above-indentified patent and that said Letters Patent is hereby corrected as shown below:

Claim 12, column 20, line 58, delete "said" (second occurrence).

Signed and Sealed this

Fourteenth Day of February, 1995

Attest:

BRUCE LEHMAN

Attesting Officer     Commissioner of Patents and Trademarks